(12) United States Patent
Turvey (10) Patent No.: US 7,279,953 B2
(45) Date of Patent: Oct. 9, 2007

(54) CURRENT SWITCH AND METHOD OF DRIVING THE SAME

(75) Inventor: Anthony E. Turvey, Reading, MA (US)

(73) Assignee: Analog Devices, Inc., Norwood, MA (US)

( * ) Notice: Subject to any disclaimer, the term of this patent is extended or adjusted under 35 U.S.C. 154(b) by 152 days.

(21) Appl. No.: 10/946,483

(22) Filed: Sep. 21, 2004

(65) Prior Publication Data

US 2006/0076969 A1    Apr. 13, 2006

(51) Int. Cl.
*H03K 17/60* (2006.01)

(52) U.S. Cl. .................................. 327/432; 327/65

(58) Field of Classification Search .............. 327/52, 327/65, 108, 378, 403, 405, 407, 411, 419, 327/478, 482, 488, 491
See application file for complete search history.

(56) References Cited

U.S. PATENT DOCUMENTS

| | | | | |
|---|---|---|---|---|
| 5,790,060 A * | 8/1998 | Tesch | ............... | 341/119 |
| 6,044,095 A * | 3/2000 | Asano et al. | ............... | 372/31 |
| 6,137,310 A | 10/2000 | Breger | ............... | 326/56 |
| 6,163,198 A * | 12/2000 | Cargill | ............... | 327/350 |
| 6,211,723 B1 | 4/2001 | Creek | ............... | 327/494 |
| 6,232,815 B1 | 5/2001 | Turvey | ............... | 327/291 |
| 6,236,254 B1 * | 5/2001 | Morgan et al. | ............... | 327/307 |
| 6,292,010 B1 | 9/2001 | Persons et al. | ............... | 324/765 |
| 6,292,031 B1 * | 9/2001 | Thompson et al. | ............... | 327/66 |
| 6,297,685 B1 * | 10/2001 | Ewen et al. | ............... | 327/513 |
| 6,362,910 B1 * | 3/2002 | Tokita | ............... | 398/183 |
| 6,429,700 B1 * | 8/2002 | Yang | ............... | 327/108 |
| 6,476,649 B1 * | 11/2002 | Goren et al. | ............... | 327/108 |
| 6,617,888 B2 * | 9/2003 | Volk | ............... | 327/67 |
| 6,677,775 B2 | 1/2004 | Babcock | ............... | 324/765 |
| 6,724,234 B1 * | 4/2004 | Iliasevitch et al. | ............... | 327/378 |
| 6,724,235 B2 * | 4/2004 | Costa et al. | ............... | 327/378 |
| 7,010,008 B2 * | 3/2006 | Pobanz | ............... | 372/38.02 |

* cited by examiner

*Primary Examiner*—Kenneth B. Wells
*Assistant Examiner*—Thomas J. Hiltunen
(74) *Attorney, Agent, or Firm*—Bromberg & Sunstein LLP (57) ABSTRACT

A method and apparatus for driving a current switch with a differential drive signal monitors both the temperature of the switch and the current through the switch. The method and apparatus dynamically control the amplitude of the drive signal as a function of the switch temperature and the current through the switch. The result is a significant reduction in base drive amplitude without compromise to offset and linearity performance of the driver. The resulting dynamic performance of the switch is substantially improved.

20 Claims, 8 Drawing Sheets

PRIOR ART

CURRENT SWITCH AND METHOD OF DRIVING THE SAME

FIELD OF THE INVENTION

The invention generally relates to current switches and more particularly, the invention relates to driving current switches.

BACKGROUND OF THE INVENTION

Current mode drivers are commonly used in a variety of automatic test and measurement applications to generate fast and precise waveforms for stimulating a device under test (DUT). Owing to the relatively low impedance at a transmission line input, and the ease with which currents can be rapidly turned on and off, such drivers are useful for applications requiring very fast edge transitions and rapid toggle rates. For example, differential signalling standards common in technologies such as Low Voltage Differential Signalling (LVDS), IEEE-1394 Firewire, Universal Serial Bus (USB), etc. . . . are well suited to current mode drive techniques.

Figure 1:
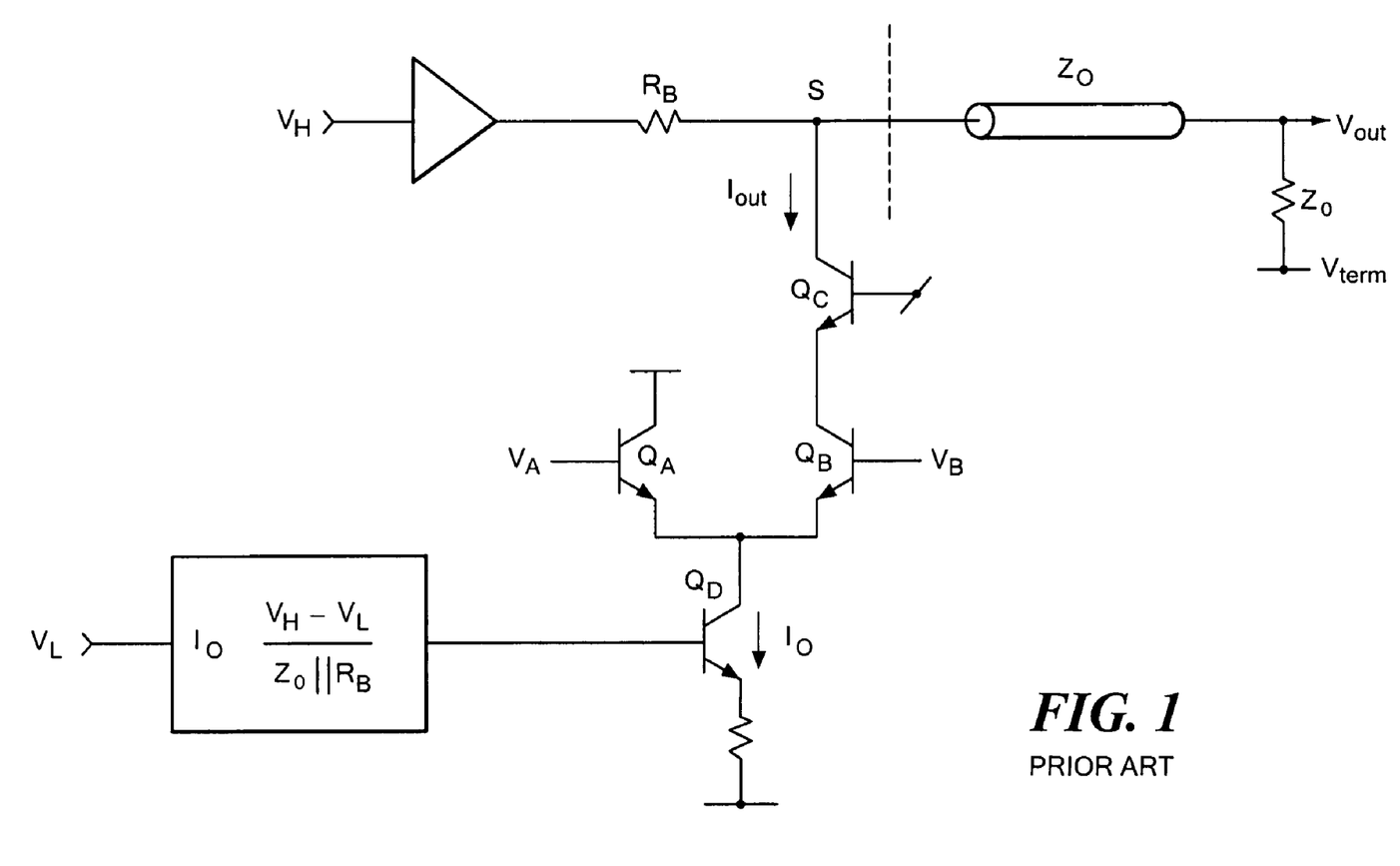
FIG. 1 schematically illustrates a conventional current-mode drive approach.

FIG. 1 schematically illustrates a conventional current-mode drive approach (hereinafter "driver 10"). Specifically, FIG. 1 shows a differential switching element (shown as a bipolar emitter coupled pair comprising $Q_A$ and $Q_B$) used to rapidly switch a programmable current generated by a current source $I_O$. The current is imposed at a summing node S formed by the transmission line and a backmatching impedance, $R_B$. Although not necessary, it may be useful to include a cascode transistor $Q_C$ to improve various performance aspects of the circuit. For the purpose of this discussion, it may be assumed that any current applied to the emitter of transistor $Q_C$ is passed unchanged to its collector.

In this example, the impedance of the transmission line generally has a 50 ohm characteristic impedance, and the matching impedance resistor $R_B$ is selected to match the transmission line as closely as possible. As the switched current is drawn from the summing node S, a voltage waveform is generated and transmitted down the transmission line, where it eventually reaches the DUT (or terminating impedance $Z_O$, which terminates the end of the line to a terminating potential, $V_{TERM}$). The magnitude of the change in voltage waveform at the summing node S is given by the magnitude of the current source, $I_O$, multiplied by the parallel combination of the transmission line impedance and the backmatching resistor $R_B$. Accordingly, by varying the magnitude of the current source, it is possible to generate a variety of output waveform amplitudes.

To provide a high level reference potential, it is common practice to connect the back terminal of the transmission line matching resistor, $R_B$, to a low impedance node via an appropriate static buffer (or dynamic driver as the case may be). When the current $I_O$ (i.e., generated by a current source that also is identified herein as $I_O$) is switched away from the summing node S, the voltage present at the input to the transmission line is simply that of the buffer driving $R_B$. FIG. 1 identifies this voltage as $V_H$. It also is common practice to receive another voltage, $V_L$, and to calculate the magnitude of $I_O$ so that, when necessary, the current $I_O$ is sufficient to pull the voltage at the summing node S down from $V_H$ to $V_L$. Although convenient for many applications, this calculation need not be implemented by specific circuitry included with the current mode driver 10. Instead, it can be calculated explicitly by the user or by some other apparatus. If the differential switching action of the emitter coupled pair is complete (i.e., there is no leakage in the off state), then the voltage at the terminated end of the transmission line, accounting for all impedances and reference levels, is given by Equation 1 below:

$$V_{OUT} = \frac{R_B V_{TERM} + Z_o V_H - R_B Z_o I_{out}}{R_B + Z_o} \qquad \text{(Equation 1)}$$

where each term is as defined in the discussion above and $I_{out}$ is that part of $I_O$ that passes though $Q_B$ and $Q_C$ after accounting for any alpha losses that may be contributed by those two nonideal devices.

Figure 2A:
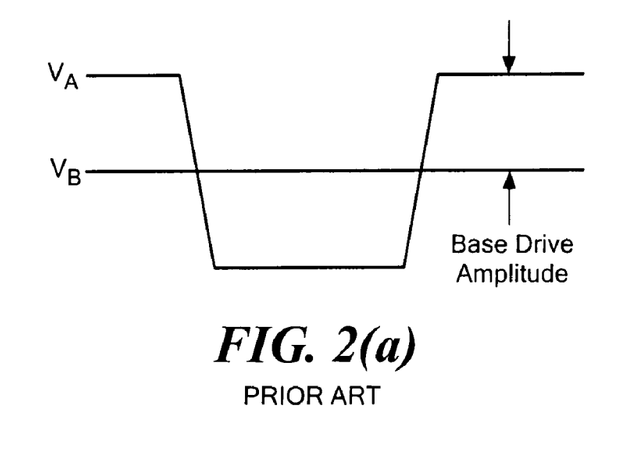
FIGS. 2A and 2B show the dynamic operation of the current mode driver shown in FIG. 1.
Figure 2B:
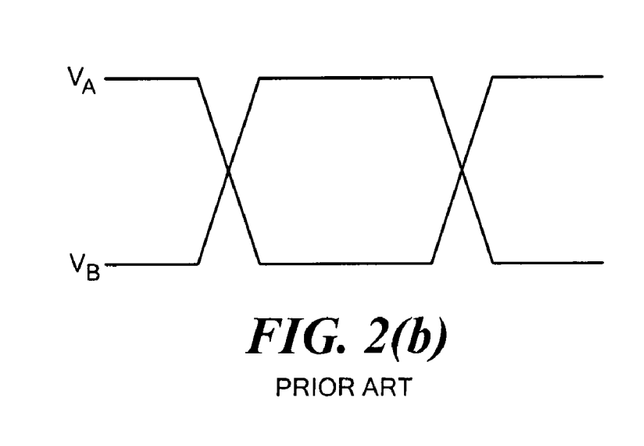

The dynamic operation of the current mode driver 10 shown in FIG. 1 can be understood with reference to FIGS. 2A and 2B. The emitter coupled pair is driven by a signal applied to the base of each of the transistors $Q_A$ and $Q_B$. The base drive signal can be single ended as depicted in FIG. 2A, or it can be differential as depicted in FIG. 2B. Both methods may be equally applied to the discussion that follows.

When the voltage $V_A$ is less than the voltage $V_B$, the transistor $Q_A$ turns off and the transistor $Q_B$ turns on. As a result, the current $I_O$ is shunted toward the summing node S by $Q_B$ and the voltage on the summing node S drops to the low state. Conversely, when $V_A$ is again made greater than $V_B$, transistor $Q_A$ turns on and $Q_B$ turns off. The current $I_O$ is then shunted away from the summing node S by $Q_A$ and the voltage waveform rises back to the high state. This cycle is repeated in accordance with the waveform pattern desired at the DUT.

Undesirably, when the dynamic operation is carried out at high speed, several parasitic charge storage elements intrinsic to switching devices $Q_A$ and $Q_B$ can cause the effective current $I_O$ to depart from the desired simple on-off nature discussed above. Consequently, because the voltage waveform at the summing node S is directly proportional to this current, undesirable aberrations and asymmetries in the current are superimposed on the generated waveform.

Figure 3:
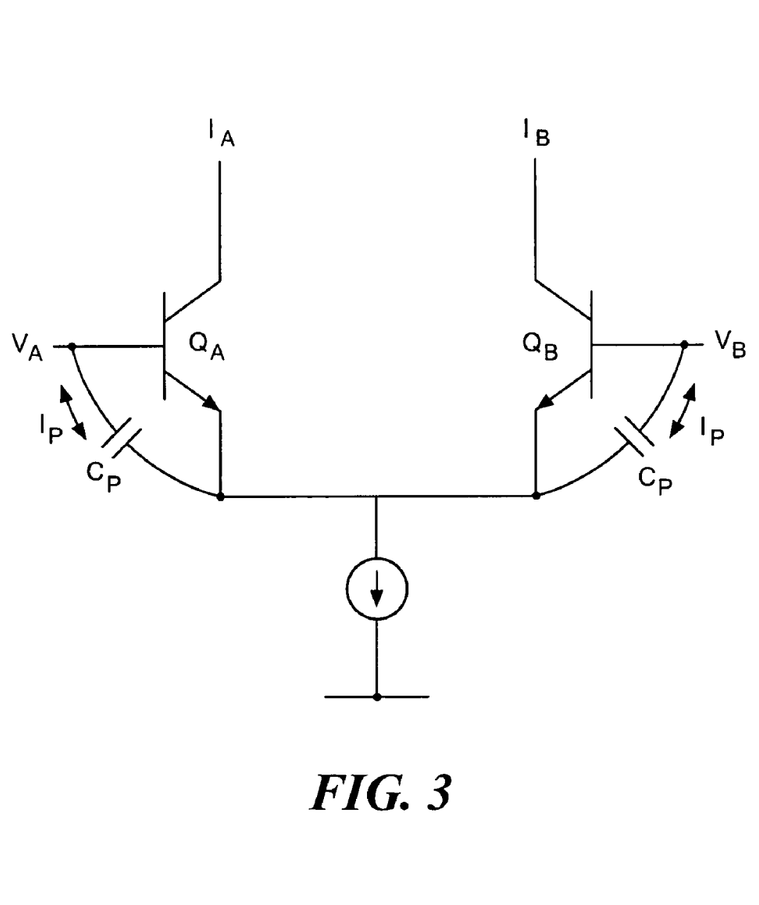
FIG. 3 schematically shows parasitic capacitors across the base-emitter junctions of the switching transistors shown in FIG. 1.

FIG. 3 schematically shows parasitic capacitors, $C_P$, across each of the base-emitter junctions of $Q_A$ and $Q_B$. These capacitors represent the intrinsic junction capacitances associated with each of the transistors, as well as the minority charge storage that occurs in the base region of the devices. In general, the capacitors typically are not equal because the intrinsic junction component is a function of bias voltage across the base-emitter junctions, and the charge storage component is a function of the current flowing through each device. As the differential pair switches current from one side to the other, these conditions change substantially during circuit operation.

As the base drive voltages are varied, transient currents are injected through the dynamic parasitic capacitances where they eventually find their way into the collector of transistor $Q_B$, and, consequently, into the summing node S. Significant aberrations are thus imposed onto the desired voltage waveform simply by the switching action of the differential pair.

Figure 4:
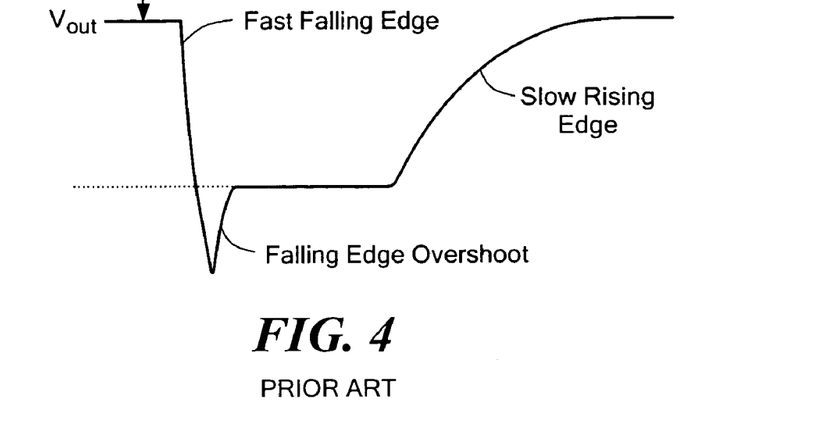
FIG. 4 illustrates a representative prior art waveform received by a device under test.

FIG. 4 illustrates such a representative waveform received by the DUT. As shown, the falling edge transition of the waveform is much faster than the rising edge, and that the falling edge also exhibits a significant overshoot. These undesirable attributes are a direct consequence of the parasitic current injected through the parasitic capacitors during the switching transient. To achieve adequate performance in high speed applications, however, it is important to minimize these aberrations.

SUMMARY OF THE INVENTION

In accordance with one aspect of the invention, a method and apparatus for driving a current switch driven by a differential (or single ended) base drive signal monitors both the temperature of the switch and the current through the switch. The method and apparatus dynamically control the amplitude of the base drive signal of the switch as a function of the switch temperature and the current through the switch. The result illustratively is a significant reduction in base drive amplitude without compromise to offset and linearity performance of the driver. The resulting dynamic performance of the switch thus is substantially improved.

In some embodiments, the drive signal is dynamically controlled by an amount substantially equal to the product of the absolute temperature of the switch and a predetermined constant value. For example, the percentage of current through the switch may comply substantially with the following equation:

$$1/(1+e^z),$$

where z is a second predetermined constant number that is a function of the predetermined constant value.

In other embodiments, the current through the switch is set to be no greater than a maximum current value. In such case, the drive signal may be dynamically controlled as a function of a predetermined constant value and a percentage of the maximum value. For example, the function may be as follows:

$$(\ln(x)/n)+1,$$

where x is the percentage of the maximum current value and n is the predetermined constant value.

Among other things, the switch may have a second switch that is driven by a second drive signal. The drive signal may be a function of the second drive signal. In other embodiments, the method and apparatus non-linearly control the amplitude of the drive signal of the switch as a function of the current through the switch.

In accordance with another aspect of the invention, a method and apparatus for driving a current switch driven by a differential drive signal monitors the temperature of the switch. The method and apparatus dynamically control the amplitude of the drive signal of the switch as a function of the switch temperature.

In accordance with another aspect of the invention, a method and apparatus for driving a current switch with a differential drive signal monitors the current through the switch. The method and apparatus dynamically and non-linearly control the amplitude of the drive signal of the switch as a function of the current through the switch.

The current through the switch may be set to be no greater than a maximum current value. The drive signal thus may be dynamically controlled as a function of a predetermined constant value and a percentage of the maximum value. Among others, the function may be as follows:

$$1/(1+e^{(m)*(x)}),$$

where x is the percentage of the maximum current value and m is the predetermined constant value.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments, the drive signal of a current switch is controlled to reduce the adverse impact of parasitic capacitance within the switch. Accordingly, in the test driver 10 example shown in FIG. 1, illustrative embodiments produce a more precise test signal than that shown in FIG. 4 by reducing overshoot, improving signal symmetry, and increasing signal rise time.

To those ends, a temperature module controls the amplitude of the drive voltage to be proportional to the temperature of the switch. Accordingly, due to the mathematical relationship of the drive voltage and temperature, the performance of the current switch is substantially temperature insensitive.

The amplitude of the drive voltage also may be controlled so that the switch output in the "off" state is substantially insensitive to the amplitude of the drive current transmitted through the switch. More specifically, logic may be configured to ensure that the amplitude of the drive voltage complies with a prespecified function that causes the switch to be substantially insensitive to the drive current.

Illustrative embodiments may be produced in the manner noted above to be insensitive to either or both temperature and drive current. Details of illustrative embodiments are discussed below.

As noted above, FIG. 1 shows a prior art current mode driver 10 that may be used with illustrative embodiments of the invention. It should be noted, however, discussion of illustrative embodiments of the invention in conjunction with the driver 10 of FIG. 1 is exemplary only and thus, not intended to limit all embodiments. Accordingly, some embodiments of the invention can be applied to other applications.

Figure 5:
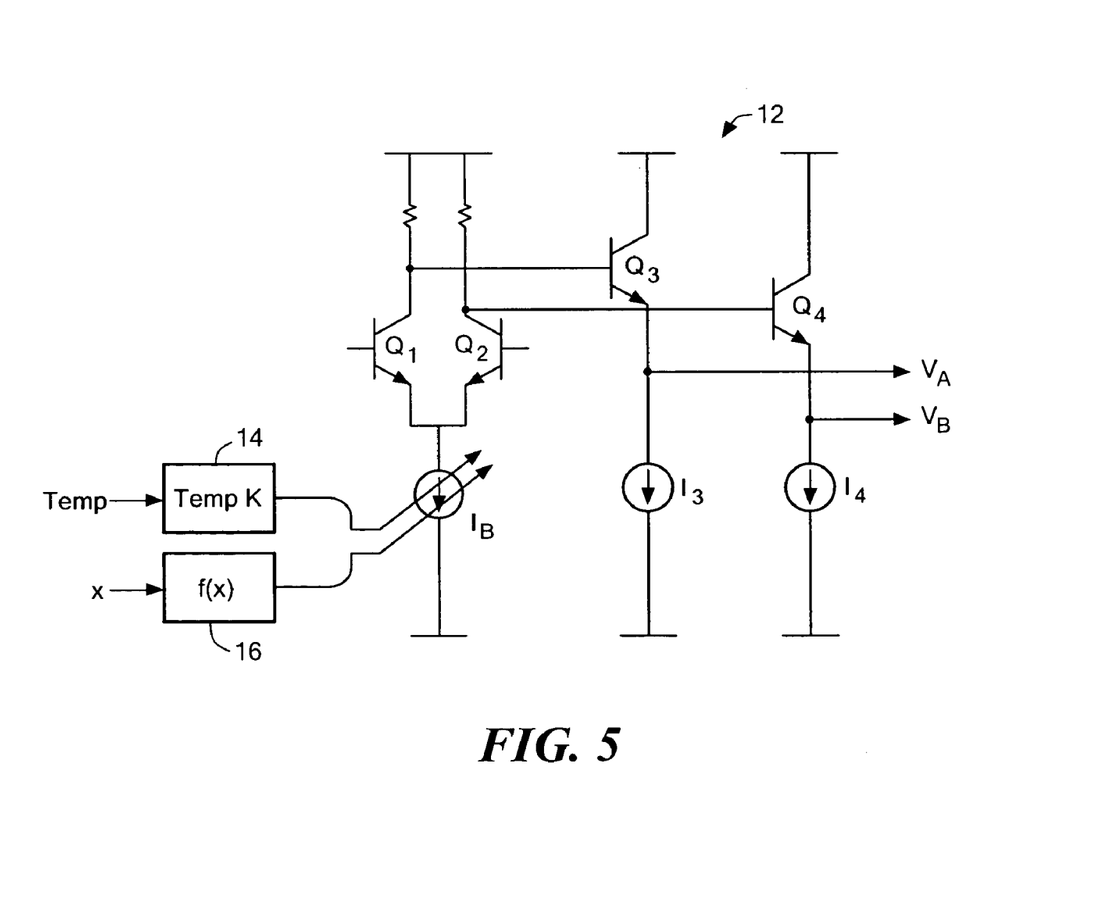
FIG. 5 schematically shows a compensation circuit capable of compensating for one or both of temperature fluctuations and current amplitude setting for the drive circuit of FIG. 1.

FIG. 5 schematically shows an exemplary compensation circuit 12 that produces the respective drive voltages $V_A$ and $V_B$ for transistors $Q_A$ and $Q_B$ of FIG. 1. The compensation circuit 12 illustratively produces these voltages in a manner that causes the driver 10 to be substantially insensitive to either or both temperature fluctuations and amplitude settings for the drive current $I_O$.

Specifically, the compensation circuit 12 includes a current mode switch having a differential switch pair Q1 and Q2 and a current source $I_B$. In addition, the compensation circuit 12 also has a pair of emitter follower transistors Q3 and Q4 with respective current sources I3 and I4. Transistor Q3 produces the voltage $V_A$, while transistor Q4 produces the voltage $V_B$.

In accordance with illustrative embodiments, the current source $I_B$ is controlled to ensure that $V_A$ and $V_B$ follow certain predefined relationships, discussed below. To that end, the compensation circuit 12 uses an open loop solution to detect temperature and current. Specifically, the compensation circuit 12 also has a temperature module 14 that effectively multiplies the absolute temperature by a constant value. In addition, the compensation circuit 12 also has a function module 16 for producing an output that is a function of both 1) the amount of current Io used by the switch and 2) the noted constant value used by the temperature module 14. Details of various aspects of the compensation circuit 12 are discussed below.

Temperature Compensation

In accordance with illustrative embodiments, the amplitude of the base drive voltages of transistors $Q_A$ and $Q_B$ of FIG. 1 is controlled to be a function of the absolute temperature (in Kelvin) of the switch. More specifically, the percent of current $I_O$ through the transistor $Q_B$ substantially follows Equation (2) below:

$$\frac{I_B}{I_O} = \frac{\alpha}{1 + e^{(V_A - V_B)/V_T}} \quad \text{(Equation 2)}$$

Note that the percent of current through the transistor $Q_A$ also complies with this equation by being 100% minus the percent value yielded by Equation 2 for the transistor $Q_B$.

The term $V_T$ of Equation (2) above, however, is directly proportional to the temperature in absolute Kelvin ($V_T = k_B T/q$), where:

T is the absolute temperature, $k_B$ is Boltzmann's constant and q is electonic charge.

Accordingly, if the base drive amplitude (i.e., $|V_A - V_B|$) is proportional to absolute temperature (PTAT) such that the base drive $|V_A - V_B| = nV_T$, where n is a constant, then the exponential term in Equation (2) can be rewritten as:

$$|V_A - V_B|/V_T = n \quad V_T/V_T = n$$

Making the base drive some multiple of absolute temperature therefore causes the exponential term to be a constant (n). In accordance with illustrative embodiments, rather than defining the amplitude of the base drive signal in terms of absolute millivolts, it is instead defined in units of $V_T$. Such units can be any whole or fractional value considered appropriate for the given application.

Using these embodiments, the nominal base drive amplitude can be reduced to the point where small offset errors may exist, but are carefully controlled to remain substantially constant over temperature. Consequently, such error can be effectively calibrated.

As an example, assume six units of $V_T$ (n=6), or approximately 156 mV at room temperature. According to Equation 2, these values result in $I_B/I_O=0.0025$, or about 0.25% leakage current in the off stage/transistor $Q_A$ or $Q_B$ (again neglecting the alpha term). At $I_O=50$ mA, this corresponds to roughly 125 microamps leakage, or 3.0 mV offset at the summing node. Indeed, under ordinary circumstances, such an uncalibrated offset error may be considered to be unacceptable, particularly due to its exponential sensitivity to temperature. Using illustrative embodiments, however, this offset is substantially temperature stable by virtue of the fact that the exponential term in Equation 2 now is constant.

The offset therefore can be effectively calibrated at the system level. In the example above, this improvement provides nearly a factor of two reduction in the base drive amplitude without incurring a temperature sensitive offset, which translates into a significant improvement in waveform integrity (see FIG. 9). Of note is the significant reduction in falling edge overshoot and the improved risetime/falltime symmetry.

Figure 6:
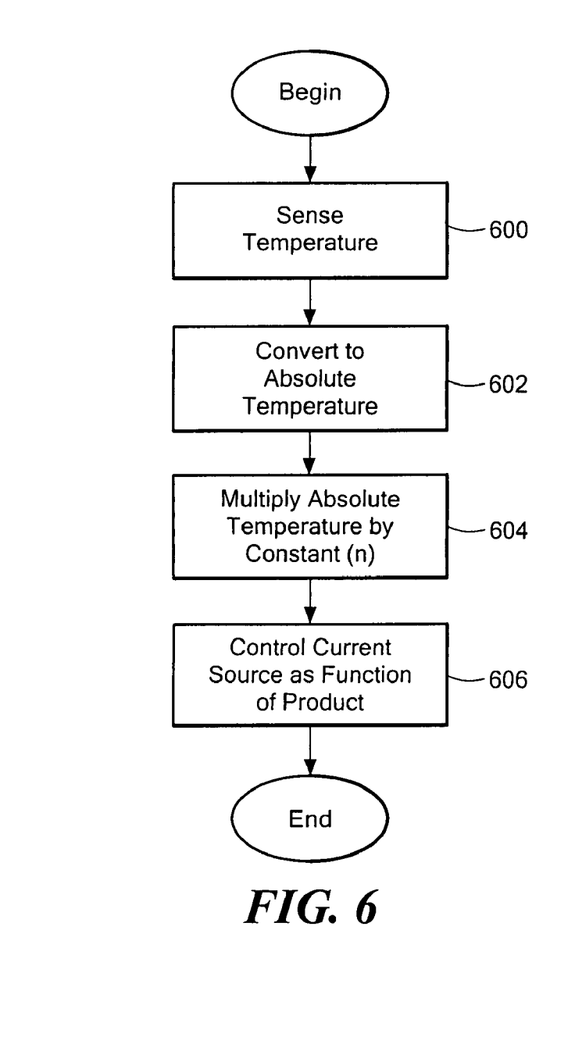
FIG. 6 schematically shows a simplified process used by some embodiments of the temperature module to implement illustrative embodiments.

Those skilled in the art can readily implement illustrative embodiments. As noted above, FIG. 5 shows one of many potential implementations. FIG. 6 schematically shows a simplified process used by some embodiments of the temperature module 14 to implement illustrative embodiments.

The process of FIG. 6 begins at step 600, in which a temperature sensor detects the temperature through the switch. Any conventional temperature sensor adapted for these purposes may be used. In alternative embodiments, the temperature sensor does not detect actual temperature of the switch. Instead, the temperature at an off-switch location may be detected. Such a location illustratively is very near the switch, such as on the same integrated substrate as the switch. Accordingly, its reading is an approximation of the actual switch temperature.

The process then continues to step 602, in which the temperature module 14 converts the temperature to absolute temperature in Kelvin. After the driver 14 converts the temperature to Kelvin, a multiplier multiplies it by the constant (n) (step 604). The current source $I_B$ then is controlled in a conventional manner to produce a current that is controlled by the product of the constant (n) and the absolute temperature (step 606).

Those skilled in the art can select the constant (n) based upon the desired output characteristics of the resultant waveform. During simulations, it was determined that sensitivity increases as the constant (n) approaches smaller values. In a corresponding manner, simulations determined that the rise/fall time mismatch of the output signal may degrade as the constant (n) approaches higher values. Anticipated values for the constant (n) for the exemplary circuit of FIG. 1 are expected to range from about 3.0 to 9.0.

Current Compensation

While the leakage currents are substantially stable as the temperature is varied, they are not necessarily stable as the current source $I_O$ varies, such as when an end user adjusts the current source $I_O$. Equation 2 shows that the leakage current for a given temperature compensated base drive amplitude is not constant with respect to the current source $I_O$, but rather a constant percentage of the current source $I_O$. Stated differently, the temperature compensation process ensures that it is constant with respect to temperature only. Accordingly, as the end user varies the current source $I_O$ to produce a variety of driver waveform amplitudes, the parasitic offset (3.0 mV in the previous example) may change significantly, thus possibly causing the system calibration constants to be less effective.

Illustrative embodiments thus also reduce the change in parasitic offset (i.e., error produced by the leakage currents) as the current source $I_O$ varies. To that end, illustrative embodiments non-linearly scale the base drive magnitudes $V_A$ and $V_B$ (as measured in n units of $V_T$) as a function of the current $I_O$.

To those ends, illustrative embodiments define an arbitrary function f(x), where $x=I_O/I_{OMAX}$ (the ratio of actual current $I_O$ produced by the current source $I_O$ relative to its maximum setting $I_{OMAX}$) and 0<x<1. To derive this function (as shown in Equation 3 below), the desired value of n at $I_{OMAX}$ is selected and the parasitic (temperature stabilized) offset is expressed as provided by Equation 2. The changing parasitic offset that would result if $I_O$ were scaled then is expressed. If these two expressions are equated, it then can be asserted that the changing offset must equal the fixed offset at $I_{OMAX}$. Embodiments then can solve for the function f(x) that makes the assertion true:

$$V_{OFFSET} = \frac{\alpha I_{omax} R}{1 + e^n} = \frac{\alpha (x I_{omax}) R}{1 + e^{nf(x)}} = Const \quad \text{(Equation 3)}$$

where R is the effective impedance at the summing mode. The term that is second from the left is the parasitic offset when $I_O$ is set to $I_{OMAX}$, and n is the number of $V_T$ units at full scale operation. This term is a constant if minor temperature dependence of alpha is neglected. The term that is second from the right is the variable offset as $I_O$ is scaled from zero to $I_{OMAX}$ (by multiplying it by the scale factor 0<x<1). Since the variable offset term on the second from the left term is constrained to equal the constant offset term on the far left, the function f(x) has the property that it scales the base drive in a manner that makes the parasitic offset substantially constant with respect to changes in $I_O$. After several manipulations and suitable substitutions, the following function (Equation 4) represents an approximation for the function f(x):

$$f(x) = \frac{\ln(x)}{n} + 1 \quad \text{(Equation 4)}$$

In illustrative embodiments, this relation is valid when x remains sufficiently greater than zero so that ln(x)>−n. Even if n is a relatively low number, such as four (under the condition that $I_O=I_{OMAX}$), then x still has a sufficient range at the low end. In that case, the approximation should suffice even for $I_O$ less than five percent of $I_{OMAX}$. The relation therefore is valid over a useful range even under very aggressive choice of base drive amplitudes (low values of n). Accordingly, the parasitic offset voltage can now be represented with an updated version of Equation 2 as shown by Equation 5 below:

$$V_{OFFSET} = \frac{x\alpha I_{omax} R}{1 + e^{nf(x)}} \quad \text{(Equation 5)}$$

Figure 7:
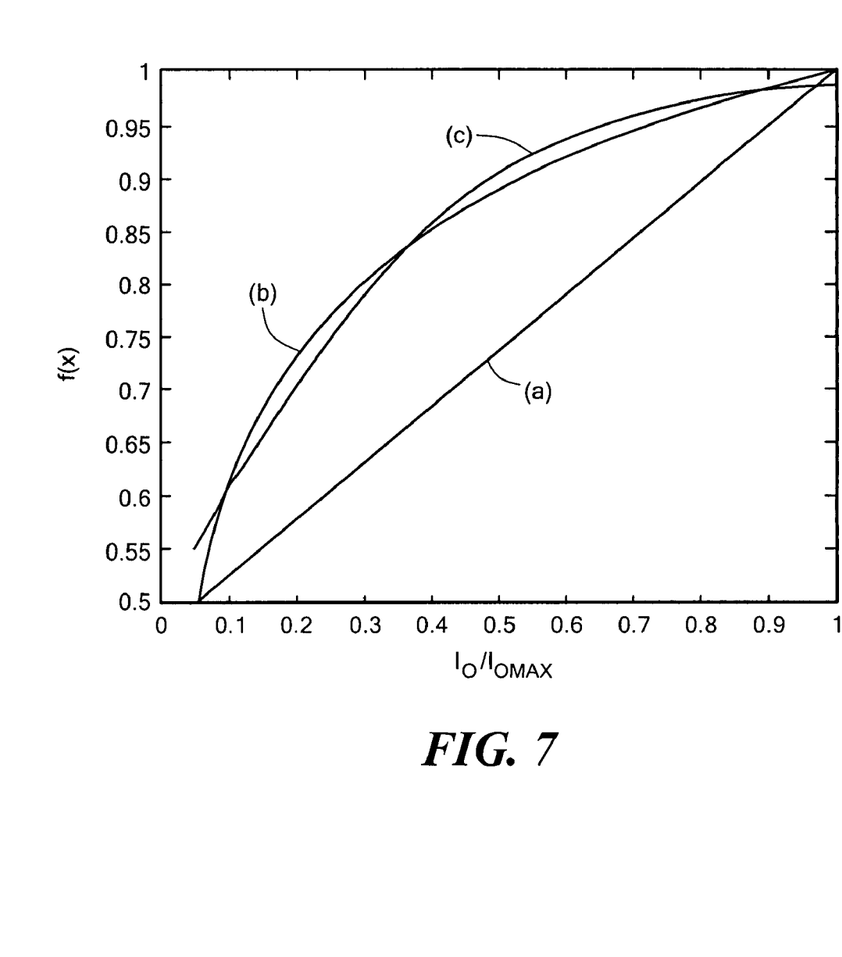
FIG. 7 shows a plot of various waveforms, including that of the function f(x).

FIG. 7 shows a plot of various waveforms, including that of the function f(x). Specifically, waveform (a) decreases linearly from 1.0 to 0.5 as $I_O$ is varied over its range from maximum $I_{OMAX}$ to a minimum of five percent of $I_{OMAX}$. Such a linear scaling of base drive is common in prior art current mode drivers. Waveform (b) shows the shape of the function of Equation 4 for the case of n=6. For the choice of n=6, waveform (c) shows that this curve can be reasonably replicated by the following approximation:

$$f(x) = \frac{1}{1 + e^{-4.5x}} \quad \text{(Equation 6)}$$

This characteristic is the same as that of the collector current on one side of a PTAT compensated emitter coupled pair, and it makes a reasonable fit to waveform (b). Accordingly, by a suitable choice of gain to properly obtain the −4.5 fitting parameter, the desired f(x) characteristic for an improved base drive amplitude scaling can be approximately generated.

Figure 8:
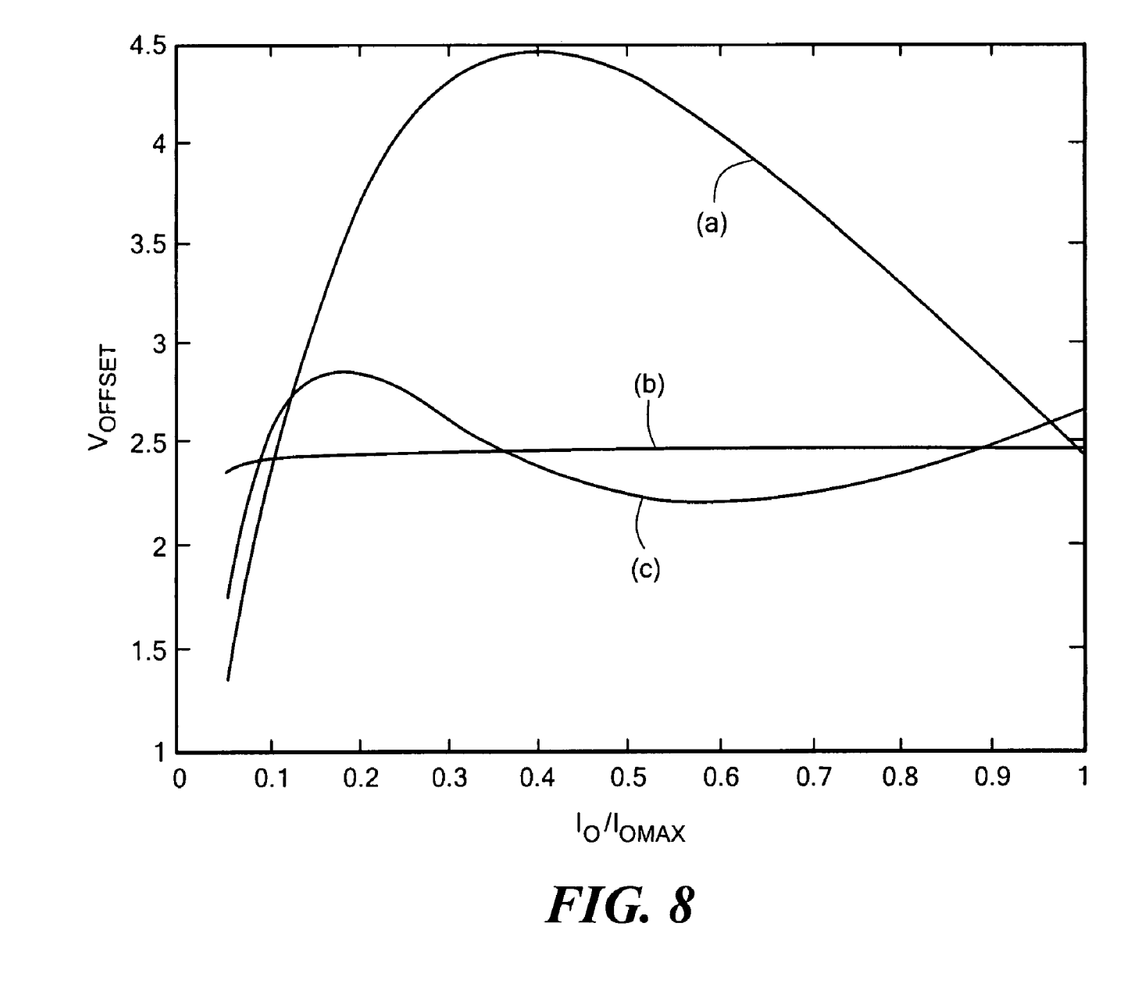
FIG. 8 shows the resulting offset voltage for the case of each function shown in FIG. 7.

Substituting Equation 4 into Equation 5 enables calculation of the parasitic offset voltage at the summing node S. FIG. 8 shows the resulting offset for the case of each f(x) shown in FIG. 7. As can be seen in trace (a) (corresponding to waveform (a) of FIG. 7), the offset variation with a simple linear scale function is greater than 3 mV. When using f(x) of Equation 4, however, the offset is more substantially fixed at a constant 2.4 mV and varies by less than about 0.2 mV (see trace (b)). Moreover, by making the simple approximation to this function as shown in Equation 6, the offset voltage is less precisely compensated (see trace (c)). Nevertheless, the variation is maintained to less than about 1 mV of drift across the entire driver range. Accordingly, a factor of three improvement over the simple linear approach can be attained. This permits a further reduction in base drive as the driver waveform amplitude is reduced (i.e., at small values of $I_O$).

Figure 9:
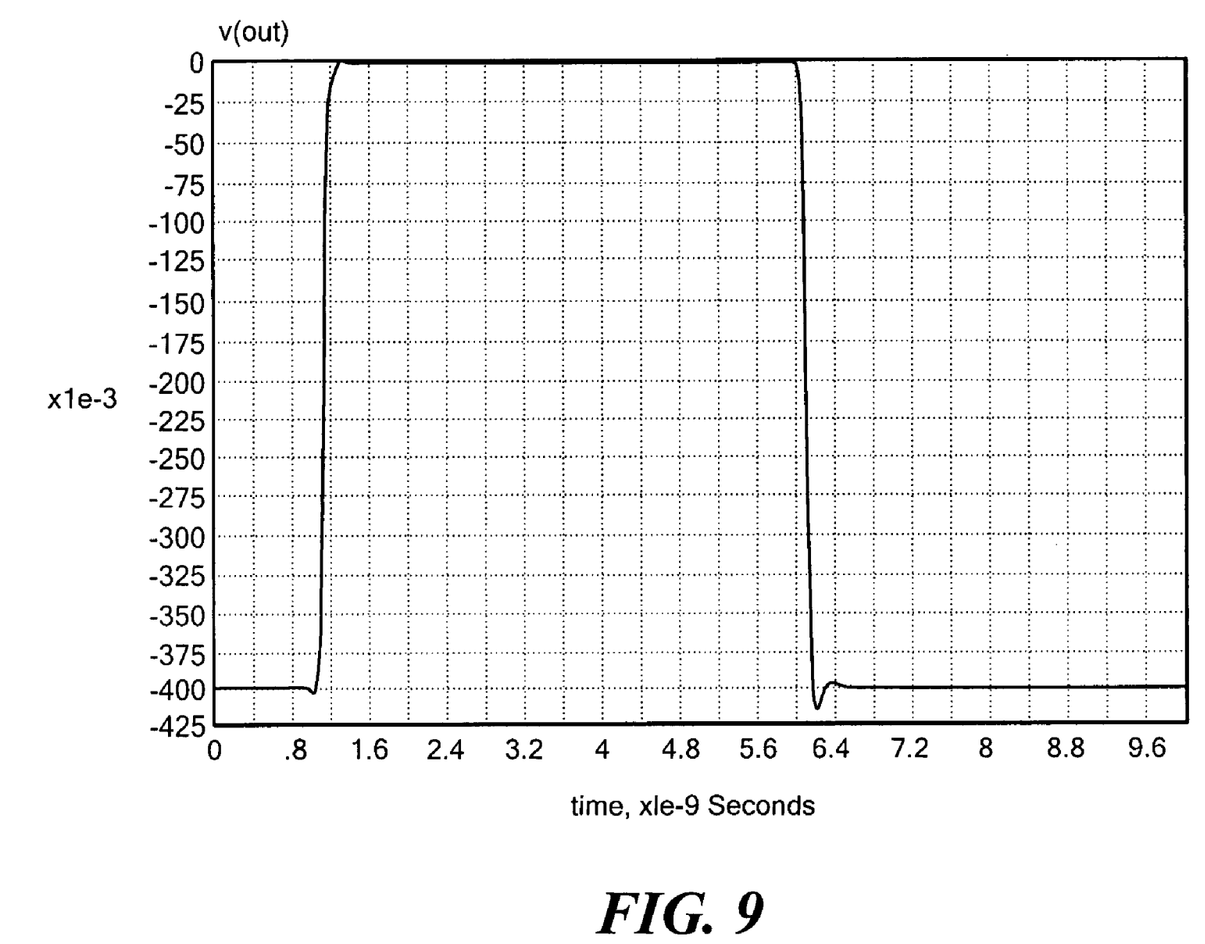
FIG. 9 schematically shows an improved output waveform produced by a current mode switch implementing illustrative embodiments of the invention.

FIG. 9 schematically shows an improved output waveform produced by a current mode switch implementing illustrative embodiments of the invention. Compared to the uncompensated waveform shown in FIG. 4, the overshoot is significantly improved. In addition, the risetime and symmetry also are significantly improved. Of course, it should be noted that the output waveform of FIG. 9 was generated under specific simulated conditions and thus, not intended to limit the scope of all embodiments. Under different conditions, the overshoot, symmetry and/or risetime may be better or worse than those shown in FIG. 9.

Figure 10:
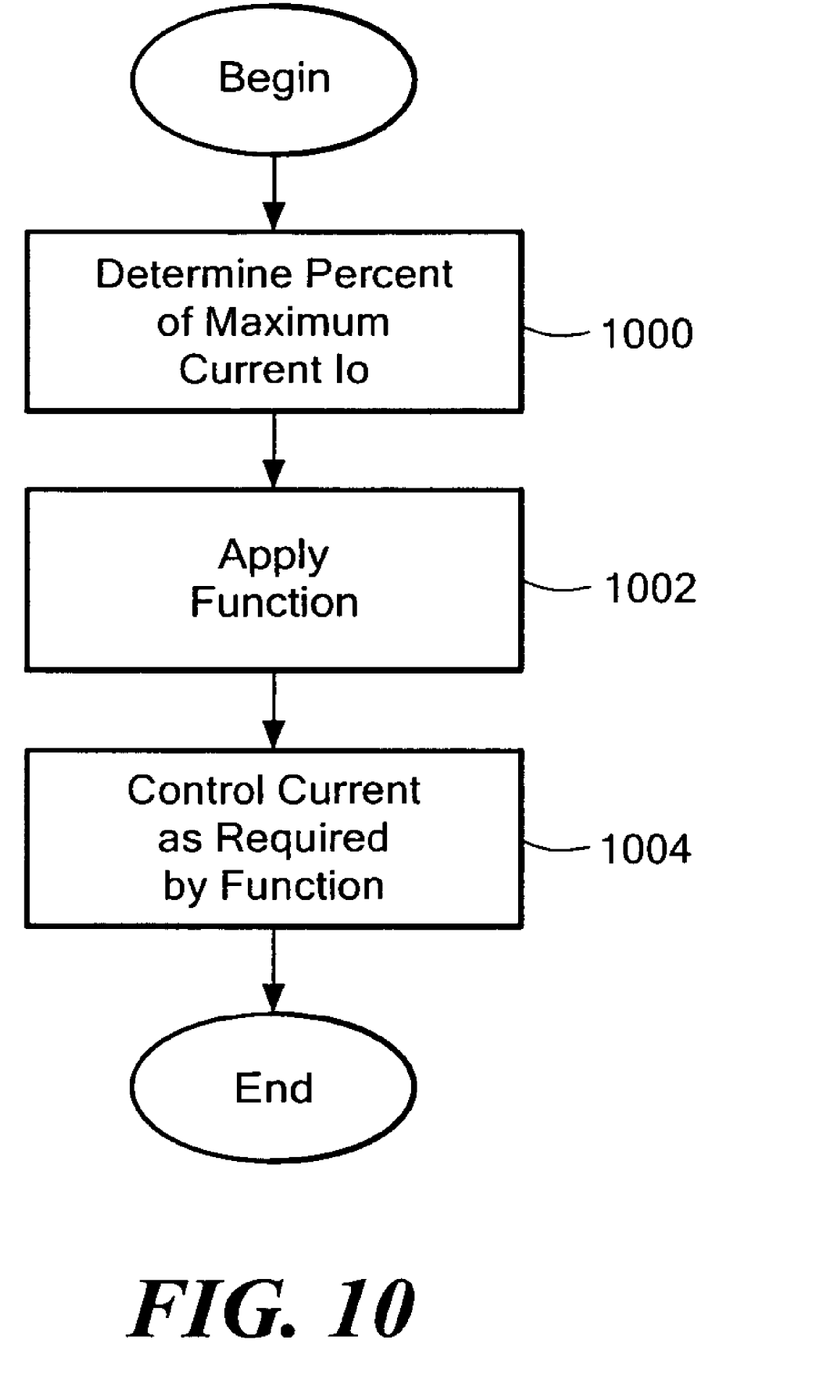
FIG. 10 schematically shows a simplified current compensation process implementing illustrative embodiments of the invention.

In a manner similar to the temperature compensation discussion above, embodiments of the current compensation method can be implemented in a variety of different manners, such as that shown in FIG. 5. FIG. 10 schematically shows a simplified current compensation process implementing illustrative embodiments of the invention. The method begins at step 1000, in which the percent of maximum current $I_O$ is determined (i.e., the x value in Equation 5). Of course, this value is determined by retrieving the actual programmed maximum current of the current source $I_O$ and detecting the amount as set by the user (see FIG. 1).

The process then continues to step 1002, in which the parameters x and n are processed in accordance with the appropriate function, such as Equation 4, to produce an output value. The output then is applied to the current source $I_B$ in a conventional manner to cause the drive voltage amplitudes $V_A$ and $V_B$ to comply with the noted relationships (step 1004).

Figure 11:
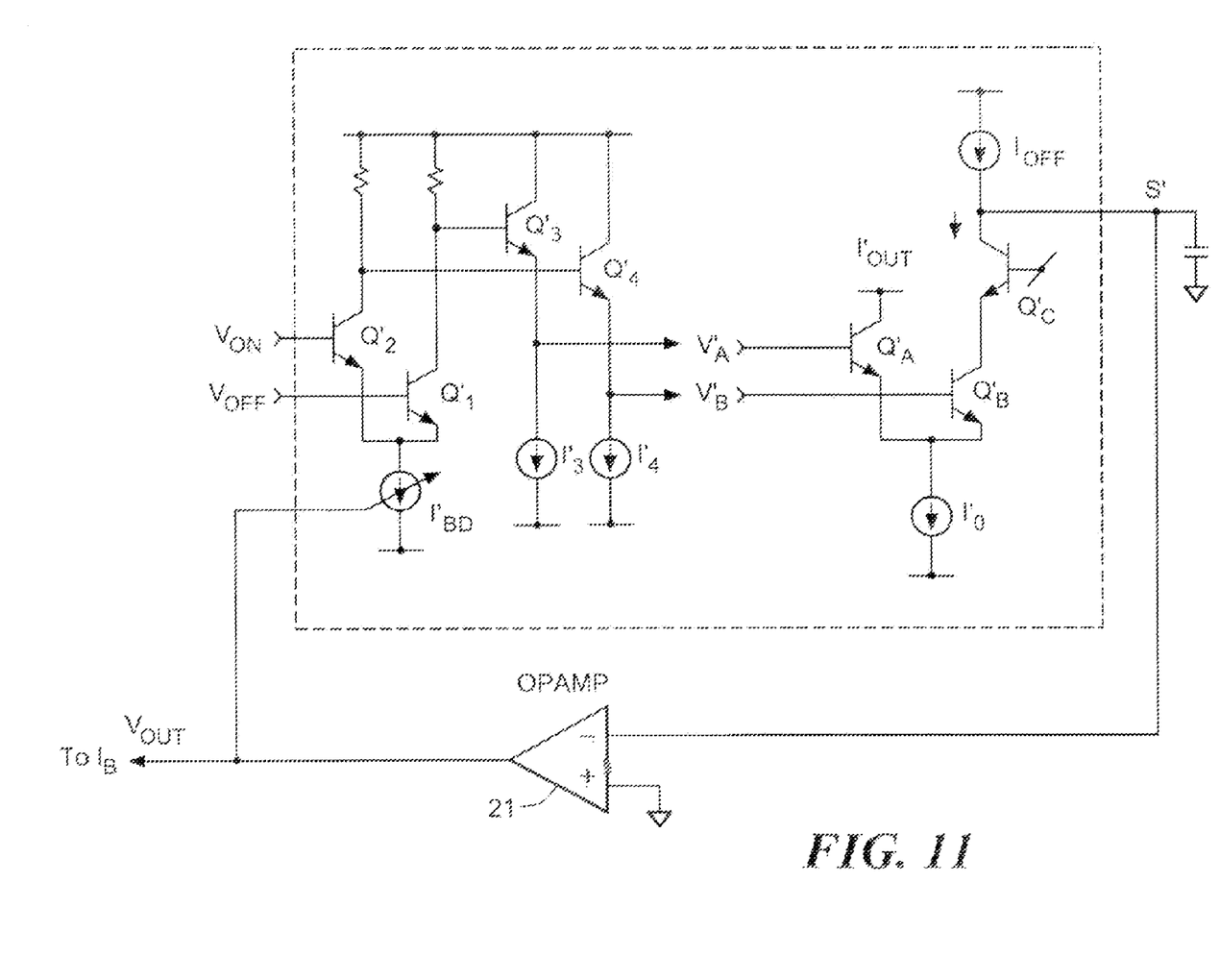
FIG. 11 schematically shows a closed loop circuit configured in accordance with an alternative embodiment of the invention.

Rather than use the discussed open loop solution of the temperature module 14 and function module 16 for controlling the current source $I_B$, some embodiments use a closed loop circuit to produce substantially identical results. FIG. 11 schematically shows a closed loop embodiment of the invention that generates an output voltage for controlling the current source $I_B$ of FIG. 5. By controlling the noted current source $I_B$, the closed loop switch generates appropriate base drive voltages ($V_A$ and $V_B$) that causes the switch to be substantially unaffected by changes in temperature and driver current $I_O$.

To those ends, FIG. 11 shows a closed loop circuit that is a substantial duplicate and scaled version (e.g., a scale factor of one) of the switches shown in FIGS. 1 and 5. The circuit elements therefore are both thermally coupled to and sized in substantially the same proportions to those in the noted switches. Accordingly, because of this thermal coupling and relative sizing, the closed loop circuit should have substantially the same relative performance as the switches shown in FIGS. 1 and 5.

The closed loop circuit thus includes an operational amplifier 21 for generating an output signal (e.g., a voltage), and a switch copy portion having an output coupled to an input of the operational amplifier 21. The output of the operational amplifier 21 also is coupled with the duplicate current source $I'_B$. It should be noted that the components in the switch copy portion are identified with "primes" to show their correspondence to the components in FIGS. 1 and 5. Accordingly, by way of example, $Q'_A$ corresponds to $Q_A$ in FIG. 1, and Q'1 corresponds to Q1 in FIG. 5.

The switch copy portion has additional items that are not shown in FIGS. 1 and 5. Specifically, Q'1 and Q'2 both are set to prespecified voltages (shown as Von and Voff) that keep them in respective "on" and "off" states. In addition, the switch copy portion also has a current source $I_{off}$ representing the desired "off" state leakage current through switch $Q_B$.

When in operation, the closed loop circuit generates an output control voltage (shown in FIG. 11 as Vout "to $I_B$") that is to be maintained if the off state leakage current (i.e., the unscaled version of $I_{off}$ in the circuit shown in FIG. 1) through switch $Q_B$ is to remain constant. This output control voltage is applied to the current source $I_B$ to generate base drive voltages $V_A$ and $V_B$ that accomplish those requirements. Accordingly, this closed loop circuit effectively monitors both the current through and temperature of the switches in FIGS. 1 and 5 to control the base drive voltages $V_A$ and $V_B$.

Various embodiments of the invention therefore represent an alternative to both switched and linear architectures. While retaining the simplicity and economy of the fully switched architecture, it avoids the cost and complexity commonly associated with a purely linear approach. By using the noted compensation methods, a significant reduction in base drive amplitude can be achieved in a switched design without overwhelming compromise to thermal and offset stability. As such, various embodiments should extend the usefulness of the switched current mode driver architecture. Illustrative embodiments therefore add value to a large number of high performance applications where absolute linearity accuracy is not required, but quality waveform fidelity is desired.

Although the above discussion discloses various exemplary embodiments of the invention, it should be apparent that those skilled in the art can make various modifications that will achieve some of the advantages of the invention without departing from the true scope of the invention.

What is claimed is:

1. A method of driving a current switch, the switch being driven by a differential drive signal, the switch switching a current, the method comprising:
   providing the current switch, the switch including a first steering transistor and a second steering transistor, the amplitude of the drive signal limited to provide incomplete current steering by the first and second steering transistors, a leakage current through the switch flowing from collector to emitter of an off transistor of the first steering transistor and the second steering transistor;
   monitoring the temperature of the switch;
   monitoring the current through the switch; and
   controlling the amplitude of the drive signal of the switch to be substantially equal to the product of the absolute temperature of the switch and a predetermined constant value; and controlling the amplitude of the drive signal of the switch as a function of the current through the switch such that the leakage current through the switch is substantially constant.

2. The method as defined by claim 1 wherein the current through the switch is set to be no greater than a maximum current value, the drive signal being controlled as a function of the predetermined constant value and a percentage of the maximum current value.

3. The method as defined by claim 2 wherein the function of the predetermined constant value and the percentage of the maximum current value is as follows:

$$(\ln(x)/n)+1,$$

where x is the ratio of the current through the switch to the maximum current value and n is the predetermined constant value.

4. The method as defined by claim 1 wherein controlling the amplitude of the drive signal of the switch as a function of the current includes non-linearly controlling the amplitude of the drive signal of the switch as a function of the current through the switch.

5. The method as defined by claim 1 wherein controlling the amplitude of the drive signal of the switch as a function of the current through the switch includes setting the current through the switch to be no greater than a maximum current value and includes setting the amplitude of the drive signal as a function of a second predetermined constant value and a percentage of the maximum current through the switch, wherein the function is as follows:

$$1/(1+e^{m*x}),$$

where x is the ratio of the current through the switch to the maximum current value and m is the second predetermined constant value.

6. A current switch driven by a differential drive signal, the switch switching a current, the switch comprising:
   a first steering transistor and a second steering transistor, the amplitude of the differential drive signal limited to provide incomplete current steering by the first and second transistors, a leakage current through the switch flowing from collector to emitter of an off transistor of the first steering transistor and the second steering transistor;

a temperature monitor capable of monitoring the temperature of the switch;

a current monitor operatively connected to monitor the current through the switch; and a signal controller operatively coupled with the temperature monitor and the current monitor, the signal controller controlling the amplitude of the drive signal of the switch to be substantially equal to the product of the absolute temperature of the switch and a predetermined constant value and controlling the amplitude of the drive signal of the switch as a function of the current through the switch such that the leakage current through the switch is substantially constant.

7. The switch as defined by claim 6 wherein the signal controller causes the current through the switch to be no greater than a maximum current value, the drive signal being controlled as a function of the predetermined constant value and a percentage of the maximum current value.

8. The switch as defined by claim 7 wherein the function is as follows:

$$(\ln(x)/n)+1,$$

where x is the ratio of the current through the switch to the maximum current value and n is the predetermined constant value.

9. The switch as defined by claim 6 wherein the switch controller non-linearly controls the amplitude of the drive signal of the switch as a function of the current through the switch.

10. A current switch driven by a differential drive signal, the switch comprising:

a first steering transistor and a second steering transistor, the amplitude of the differential drive signal limited to provide incomplete current steering by the first and second transistors;

a temperature monitor operatively coupled to monitor the temperature of the switch; and a switch controller operatively coupled with the temperature monitor, the switch controller controlling the amplitude of the drive signal of the switch to be substantially equal to the product of the absolute temperature of the switch and a predetermined constant value wherein the temperature monitor is a closed loop system.

11. A method of driving a current switch, the switch being driven by a differential drive signal, the switch switching a current, the method comprising:

providing the current switch, the switch including a first steering transistor and a second steering transistor, the amplitude of the drive signal limited to provide incomplete current steering by the first and second steering transistors, a leakage current through the switch flowing from collector to emitter of an off transistor of the first steering transistor and the second steering transistor;

monitoring the current through the switch; and controlling the amplitude of the drive signal of the switch as a function of the current through the switch such that the leakage current through the switch is substantially constant.

12. The method as defined by claim 11 wherein controlling includes setting the current through the switch to be no greater than a maximum current value, the drive signal being controlled as a function of a predetermined constant value and a percentage of the maximum current value.

13. The method as defined by claim 12 wherein the function is as follows:

$$(\ln(x)/n)+1,$$

where x is the ratio of the current through the switch to the maximum current value and n is the predetermined constant value.

14. The method as defined by claim 12 wherein controlling the amplitude of the drive signal of the switch as a function of the current through the switch includes setting the amplitude of the drive signal as a function of a second predetermined constant value and a percentage of the maximum current through the switch wherein the function is as follows:

$$1/(1+e^{m*x}),$$

where x is the ratio of the current through the switch to the maximum current value and m is a second predetermined constant value.

15. A current switch driven by a differential drive signal, the switch switching a current, the switch comprising:

a first steering transistor and a second steering transistor, the amplitude of the differential drive signal limited to provide incomplete current steering by the first and second transistors, a leakage current through the switch flowing from collector to emitter of an off transistor of the first steering transistor and the second steering transistor;

a current monitor capable of monitoring the current through the switch; and a switch controller operatively coupled with the current monitor, the switch controller controlling the amplitude of the drive signal of the switch as a function of the current through the switch such that the leakage current through the switch is substantially constant.

16. The switch as defined by claim 15 wherein the switch controller sets the current through the switch to be no greater than a maximum current value, the drive signal being controlled as a function of a predetermined constant value and a percentage of the maximum value.

17. The switch as defined by claim 16 wherein the function is as follows:

$$(\ln(x)/n)+1,$$

where x is the ratio of the current through the switch to the maximum current value and n is the predetermined constant value.

18. The switch as defined by claim 16 wherein the function is as follows:

$$1/(1+e^{m*x}),$$

where x is the ratio of the current through the switch to the maximum current value and m is the predetermined constant value.

19. The switch as defined by claim 15 further including a temperature monitor capable of monitoring the temperature of the switch, the switch controller operatively coupled with the temperature monitor, the switch controller controlling the amplitude of the drive signal of the switch to be substantially equal to the product of the absolute temperature of the switch and a predetermined constant value, at least one of the temperature monitor and current monitor being a closed loop system.

20. The switch as defined by claim 15 wherein the current monitor is a closed loop system.

* * * * *